United States Patent
Padmanabhan et al.

(10) Patent No.: US 9,660,062 B2
(45) Date of Patent: May 23, 2017

(54) BIDIRECTIONAL HEMT AND AN ELECTRONIC PACKAGE INCLUDING THE BIDIRECTIONAL HEMT

(71) Applicant: SEMICONDUCTOR COMPONENTS INDUSTRIES, LLC, Phoenix, AZ (US)

(72) Inventors: Balaji Padmanabhan, Tempe, AZ (US); Prasad Venkatraman, Gilbert, AZ (US); Chun-Li Liu, Mesa, AZ (US); Peter Moens, Erwetegem (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/133,657

(22) Filed: Apr. 20, 2016

(65) Prior Publication Data
US 2016/0322485 A1    Nov. 3, 2016

Related U.S. Application Data

(60) Provisional application No. 62/154,705, filed on Apr. 30, 2015, provisional application No. 62/154,775, filed on Apr. 30, 2015.

(51) Int. Cl.
*H01L 29/66* (2006.01)
*H01L 29/747* (2006.01)
(Continued)

(52) U.S. Cl.
CPC ........ *H01L 29/747* (2013.01); *H01L 23/4952* (2013.01); *H01L 23/49524* (2013.01); *H01L 23/49541* (2013.01); *H01L 23/49562* (2013.01); *H01L 23/49575* (2013.01); *H01L 24/40* (2013.01); *H01L 25/115* (2013.01); *H01L 27/088* (2013.01); *H01L 27/0883* (2013.01);
(Continued)

(58) Field of Classification Search
CPC . H01L 29/747; H01L 29/742; H01L 27/0883; H01L 23/49562; H01L 23/49575; H01L 29/2003; H01L 23/4952
See application file for complete search history.

(56) References Cited

U.S. PATENT DOCUMENTS 7,852,137 B2 * 12/2010 Machida ............. H01L 27/0605
                                                           327/427
7,875,907 B2 *  1/2011 Honea ................. H01L 27/0605
                                                           257/192
(Continued)

*Primary Examiner* — Thomas L Dickey
*Assistant Examiner* — Damon Hillman
(74) *Attorney, Agent, or Firm* — Abel Law Group, LLP

(57) ABSTRACT

An electronic device can include a bidirectional HEMT. In an aspect, a packaged electronic device can include the bidirectional HEMT can be part of a die having a die substrate connection that is configured to be at a fixed voltage, electrically connected to drain/source or source/drain depending on current flow through the bidirectional HEMT, or electrically float. In another aspect, the electronic device can include Kelvin connections on both the drain/source and source/drain side of the circuit. In a further embodiment, a circuit can include the bidirectional HEMT, switch transistors, and diodes with breakdown voltages to limit voltage swings at the drain/source and source/drain of the switch transistors.

19 Claims, 7 Drawing Sheets

(51) Int. Cl.
  *H01L 29/74*   (2006.01)
  *H01L 27/088*  (2006.01)
  *H01L 23/495*  (2006.01)
  *H01L 29/205*  (2006.01)
  *H01L 29/40*   (2006.01)
  *H01L 29/423*  (2006.01)
  *H01L 29/778*  (2006.01)
  *H01L 25/11*   (2006.01)
  *H03K 17/687*  (2006.01)
  *H01L 23/00*   (2006.01)

(52) U.S. Cl.
  CPC .......... *H01L 29/205* (2013.01); *H01L 29/404* (2013.01); *H01L 29/4238* (2013.01); *H01L 29/742* (2013.01); *H01L 29/7416* (2013.01); *H01L 29/7786* (2013.01); *H01L 29/7787* (2013.01); *H03K 17/6874* (2013.01); *H01L 2224/0603* (2013.01); *H01L 2224/40245* (2013.01); *H01L 2224/48247* (2013.01); *H03K 2017/6878* (2013.01); *H03K 2217/0009* (2013.01); *H03K 2217/0018* (2013.01)

(56) References Cited

U.S. PATENT DOCUMENTS

| | | |
|---|---|---|
| 2005/0189561 A1 | 9/2005  | Kinzer et al. |
| 2006/0175633 A1 | 8/2006  | Kinzer |
| 2007/0215899 A1 | 9/2007  | Herman |
| 2009/0065810 A1 | 3/2009  | Honea et al. |
| 2016/0322351 A1 | 11/2016 | Moens et al. |

* cited by examiner

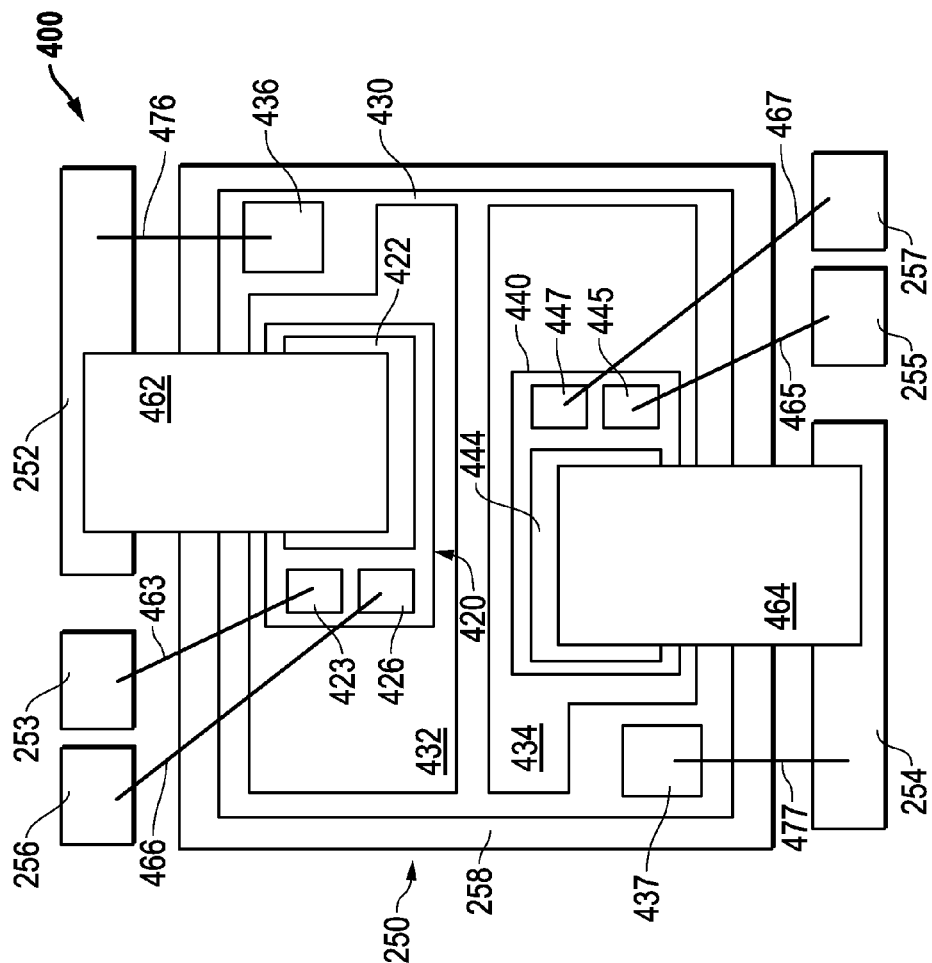
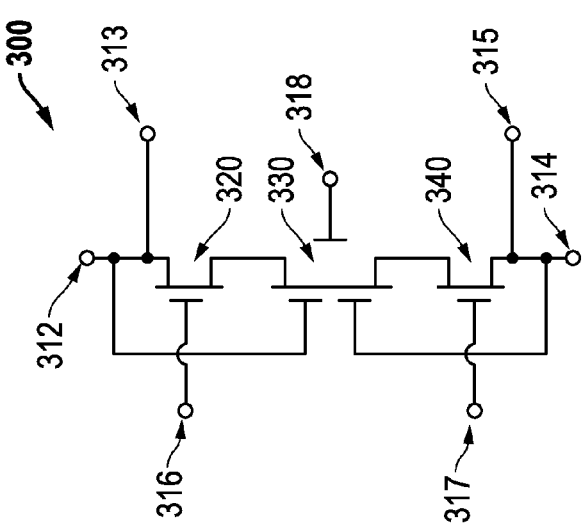
FIG. 4
FIG. 3

BIDIRECTIONAL HEMT AND AN ELECTRONIC PACKAGE INCLUDING THE BIDIRECTIONAL HEMT

CROSS-REFERENCE TO RELATED APPLICATIONS

This application claims priority under 35 U.S.C. §119(e) to U.S. Provisional Patent Application No. 62/154,705 entitled "Wide Band Gap Cascode Device, Its Use in a Half Bridge Circuit, and Related Packages," by Balaji Padmanabhan et al., filed Apr. 30, 2015, and to U.S. Provisional Patent Application No. 62/154,775 entitled "Wide Band Gap Cascode Device, Its Use in a Half Bridge Circuit, and Related Packages," by Balaji Padmanabhan et al., filed Apr. 30, 2015, which are assigned to the current assignee hereof and incorporated herein by reference in their entireties.

FIELD OF THE DISCLOSURE

The present disclosure relates to circuits and electronic packages, and more particularly, to bidirectional high-electron mobility transistor circuits and electronic packages including bidirectional high-electron mobility transistors.

RELATED ART

High electron mobility transistors (HEMTs), and GaN transistors in particular, are used for their ability to carry large amounts of current at relatively high temperatures. Bidirectional HEMTs and their circuits have been disclosed but have one or more problems. Further improvements in circuits including HEMTs are desired.

BRIEF DESCRIPTION OF THE DRAWINGS

Embodiments are illustrated by way of example and are not limited in the accompanying figures.

FIG. 3 includes a schematic of a circuit including a bidirectional HEMT, switch transistors, and Kelvin connections.

FIG. 4 includes an illustration of a top view of a package configuration for a packaged electronic device including the circuit of FIG. 3.

Figure 2:
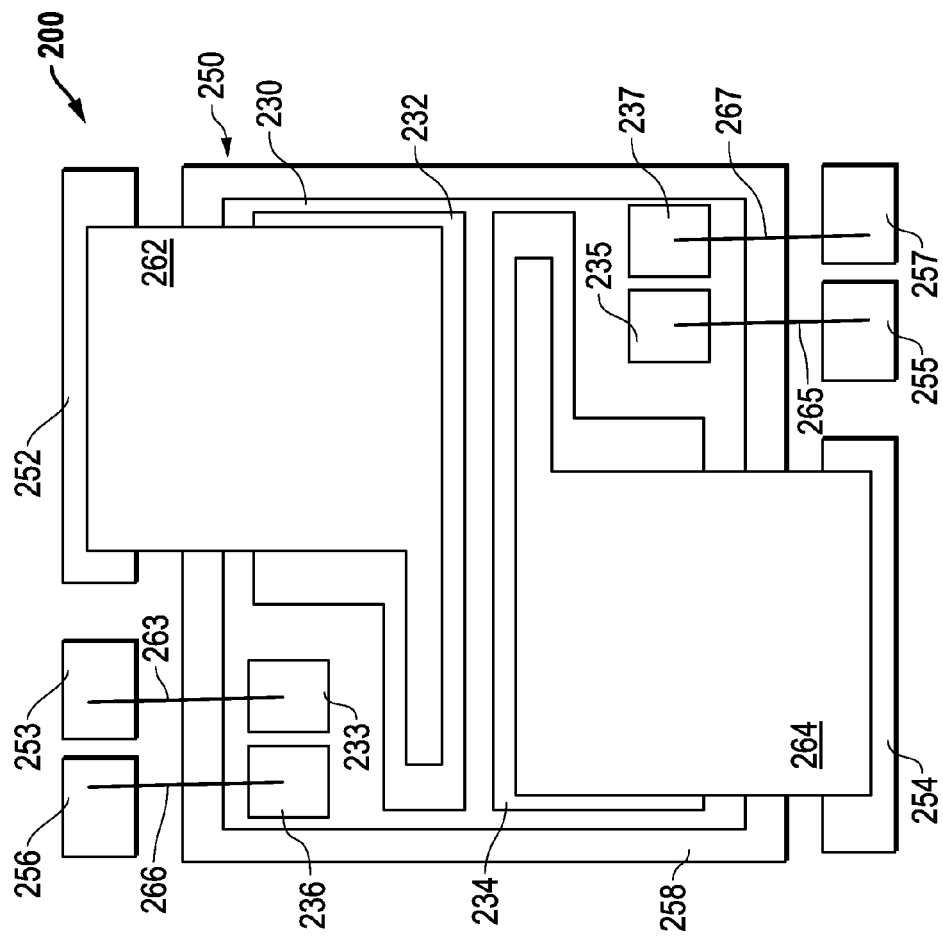
FIG. 2 includes an illustration of a top view of a package configuration for a packaged electronic device including the bidirectional HEMT of FIG. 1.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "compound semiconductor" is intended to mean a semiconductor material that includes at least two different elements. Examples include SiC, SiGe, GaN, InP, $Al_vGa_{(1-v)}N$, CdTe, and the like. A III-V semiconductor material is intended to mean a semiconductor material that includes at least one trivalent metal element and at least one Group 15 element. A III-N semiconductor material is intended to mean a semiconductor material that includes at least one trivalent metal element and nitrogen. A Group 13-Group 15 semiconductor material is intended to mean a semiconductor material that includes at least one Group 13 element and at least one Group 15 element.

The term "carrier impurity" is intended to mean (1) when an acceptor, an impurity within a compound having a different valence state as compared to at least 90% of all cations within the compound, or (2) when a donor, an impurity within a compound having a different valence as compared to at least 90% of all anions within the compound. For example, C, Mg, and Si are acceptors with respect to GaN because they can trap electrons. As used herein, Al is not a carrier impurity with respect to GaN because Al and Ga have a 3+ valence. A carrier impurity may be intentionally added or may be present as a naturally occurring impurity or as a consequence of forming a layer that includes the impurity. Acceptors and donors are carrier impurities of opposite carrier types.

Although a layer or a region may be described herein as a donor impurity type or an acceptor impurity type, skilled artisans understand that the impurity types can be reversed and are also possible in accordance with the present description.

Unless stated explicitly to the contrary, the terms "carrier impurity concentration" or "concentration of a carrier impurity", when referring to a layer, a film, or a region, is intended to mean an average concentration for such layer, film, or region.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

Group numbers corresponding to columns within the Periodic Table of Elements based on the IUPAC Periodic Table of Elements, version dated Jan. 21, 2011.

The terms "normal operation" and "normal operating state" refer to conditions under which an electronic component or device is designed to operate. The conditions may be obtained from a data sheet or other information regarding voltages, currents, capacitances, resistances, or other electrical parameters. Thus, normal operation does not include operating an electrical component or device well beyond its design limits.

The term "high voltage," with reference to a layer, a structure, or a device, is intended to mean that such layer, structure, or device can withstand at least 150 V difference across such layer, structure, or device (e.g., between a source and a drain of a transistor when in an off-state) without exhibiting dielectric breakdown, avalanche breakdown, or the like.

The term "nominal design voltage" is intended to mean a voltage for which an electronic device or circuit is designed. An electronic device or circuit may be designed to operate with a voltage difference between its terminals. In practice, the voltage difference may vary slightly. Thus, an electronic device or circuit may have a nominal design voltage of 200 V, even though the design may take into account a voltage deviation of a power supply. Accordingly, such an electronic device or circuit may operate at 205 V, due to a voltage deviation of a power supply, yet the electronic device or circuit has a nominal design voltage of 200 V.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a bidirectional HEMT. In an aspect, a die including the bidirectional HEMT has a die substrate connection that is separate from the drain/source and source/drain terminals. In another aspect, a packaged electronic device can include Kelvin connections to drain/source and source/drain of transistors that are separate from connections where nearly all current flows through the circuit. The Kelvin connections on both sides of the circuit allow for a more accurate voltage measurement when controlling the circuit. The Kelvin connections are not required in all embodiments, and thus, a circuit without the Kelvin connections can be used in a packaged electronic device having fewer electronic connections. Different die configurations with the same package substrate allow more flexibility to a designer based on needs or requirements for a particular embodiment.

In a further aspect, a circuit can include a bidirectional HEMT with switch transistors. A pair of diodes can be used, wherein a cathode of one of the diodes is coupled to a drain/source terminal of the circuit, a cathode of the other diode is coupled to the source/drain terminal of the circuit, and the anodes of the diodes are coupled to one another. The circuit has an unclamped inductance switching (UIS) capability that can help protect transistors within the circuit. The UIS capability may allow the transistors to be designed more aggressively to provide better performance, as compared to a circuit without the UIS capability.

The concepts as described herein are better understood with the embodiments as illustrated and described below. Such embodiments are intended to exemplify and not limit the scope of the present invention, which is defined by the appended claims.

Figure 1:
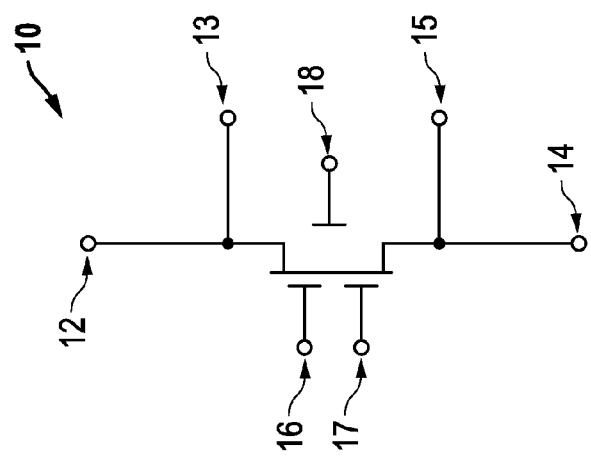
FIG. 1 includes a schematic of a bidirectional HEMT.

FIG. 1 includes a schematic of a bidirectional HEMT 10 that is controlled by a pair of gates. A drain/source of the bidirectional HEMT 10 is coupled to drain/source terminal 12 and a Kelvin connection terminal 13, and a source/drain of the bidirectional HEMT 10 is coupled to source/drain terminal 14 and a Kelvin connection terminal 15. The significance of the Kelvin contacts will be addressed with respect to an exemplary package configuration as illustrated in FIG. 2. One of the gates of the bidirectional HEMT 10 is coupled to a gate terminal 16, and another gate of the bidirectional HEMT 10 is coupled to a gate terminal 17. The bidirectional HEMT 10 is within or over a die substrate that is coupled to a die substrate terminal 18. In a particular embodiment, each of the couplings can be an electrical connection.

FIG. 2 includes an exemplary packaged electronic device 200 of a physical embodiment for the bidirectional HEMT 10. The packaged electronic device 200 includes a die 230 that can be physically coupled to a package substrate 250. The die 230 includes bond pads for making connections to the die 230, and the package substrate 250 can include package leads.

A drain/source bond pad 232 of the die 230 is electrically connected to a drain/source package lead 252 of the package substrate 250. As illustrated in the embodiment of FIG. 2, the electrical connection is made by a conductor 262 that contacts the drain/source bond pad 232 and the drain/source package lead 252. A Kelvin bond pad 233 of the die 230 is electrically connected to a Kelvin package lead 253 of the package substrate 250. The electrical connection is made by a conductor 263 that contacts the Kelvin bond pad 233 and the Kelvin package lead 253. A source/drain bond pad 234 of the die 230 is electrically connected to a source/drain package lead 254 of the package substrate 250. The electrical connection is made by a conductor 264 that contacts the source/drain bond pad 234 and the source/drain package lead 254. A Kelvin bond pad 235 of the die 230 is electrically connected to a Kelvin package lead 255 of the package substrate 250. The electrical connection is made by a conductor 265 that contacts the Kelvin bond pad 235 and the Kelvin package lead 255.

Although the drain/source bond pad 232, drain/source package lead 252, the Kelvin bond pad 233 and Kelvin package lead 253 are electrically connected to one another, the Kelvin bond pad 233 and Kelvin package lead 253 can be parts of a Kelvin connection to allow for a more accurate voltage measurement at the drain/source of the bidirectional HEMT 10, as current flowing through the drain/source bond pad 232 and drain/source package lead 252 may be sufficiently high to cause a voltage measurement to be significantly less accurate than through the Kelvin connection. A similar relationship exists regarding the source/drain bond pad 234, source/drain package lead 254, the Kelvin bond pad 235 and Kelvin package lead 255.

A gate bond pad 236 of the die 230 is electrically connected to a gate package lead 256 of the package substrate 250. The electrical connection is made by a conductor 266 that contacts the gate bond pad 236 and the gate package lead 256. A gate bond pad 237 of the die 230 is electrically connected to a gate package lead 257 of the package substrate 250. The electrical connection is made by a conductor 267 that contacts the gate bond pad 237 and the gate package lead 257.

The die substrate of the die 230 (not visible in FIG. 2) is electrically connected to a die substrate package lead 258 of the package substrate 250. The electrical connection is made by a conductor (not illustrated) that contacts the die substrate and the die substrate package lead 258. In a typical unidirectional HEMT, the die substrate is electrically connected to the source of the unidirectional HEMT, as such a configuration may require fewer electrical connections from outside the packaged electronic device. Unlike a unidirectional HEMT, the separate electrical connection allows the die substrate to be biased independently of the source/drain and drain/source of the bidirectional HEMT. Furthermore, the die substrate may be electrically connected to the source/drain when current flows in one direction through the bidirectional HEMT and electrically connected to the drain/source when the current flows in the opposite direction through the bidirectional HEMT. The die substrate connection can also be connected to an independent potential or connected to ground potential or left floating.

Each of the connectors 262 to 267 and the one for the die substrate may be in any one of a variety of forms. A connector can be a wire, a conductive bump, a clip, an interposer, or the like. The selection of a particular type of connector can be made by skilled artisans after considering performance and package configurations. As illustrated in the embodiment, the conductors 262 and 264 are clips that can be useful for the large current that can flow through each clip. In an embodiment, each clip can be replaced by wires or conductive bumps (for a flip chip connecting technique). The conductors 263, 265, 266, and 267 are wires and can be replaced by conductive bumps or clips. In another embodiment, the connector that contacts the die substrate and the die substrate package lead 258 can include a solder or a conductive adhesive, such as conductive epoxy etc.

FIG. 3 includes a schematic of a circuit 300 that includes a bidirectional HEMT 330 and switch transistors 320 and 340. A source of the switch transistor 320 is coupled to a drain/source terminal 312 and a Kelvin connection terminal 313, and a drain of the switch transistor 320 is coupled to a drain/source of the bidirectional HEMT 330. A source/drain of the bidirectional HEMT 330 is coupled to a drain of the switch transistor 340, and a source of the switch transistor 340 is coupled to source/drain terminal 314 and a Kelvin connection terminal 315. One of the gates of the bidirectional HEMT 330 is coupled to the source of the switch transistor 320, and another gate of the bidirectional HEMT 330 is coupled to the source of the switch transistor 340. The gate of the switch transistor 320 is coupled to a gate terminal 316, and the gate of the switch transistor 340 is coupled to a gate terminal 317. The bidirectional HEMT 330 is within or over a die substrate that is coupled to a die substrate terminal 318. In a particular embodiment, each of the couplings can be electrical connections. In an embodiment, switch transistors 320 and 340 can be enhancement mode transistors, and in another embodiment, the switch transistors 320 and 340 can be depletion mode transistors. The switch transistors 320 and 340 can be parts of the same die as the bidirectional HEMT 330, or the switch transistors 320 and 340 and the bidirectional HEMT 330 can be on different dies. The switch transistors 320 and 340 can be Si metal-oxide-semiconductor field-effect transistors (MOSFETs) or can include a compound semiconductor material (e.g., SiC, $Al_{(1-x)}Ga_xN$ where $0 \leq x \leq 1$, GaAs, InP, or the like).

Below is a table with operating states and voltages for the circuit 300. While particular values are given to exemplify a particular embodiment, other voltages may be used without deviation from the scope of the present invention that is defined by the appended claims.

Below is a table that includes operating states, conditions, and voltages at various terminal (as noted in subscripts in the table) for the circuit 300. In an embodiment, the die substrate terminal can be electrically connected to a fixed voltage, such as 0 V or ground. In another embodiment, the die substrate terminal 318 may be coupled to a switch that can be used to electrically connect the die substrate terminal 318 to the source/drain terminal 314 when the source/drain terminal 314 is the source for the circuit or to the drain/source terminal 312 when the drain/source terminal 312 is the source for the circuit. The voltages in the table are merely exemplary and are not intended to limit the scope of the present invention. In another embodiment, the circuit may be used in an application where the nominal design voltage is 200 V, 500 V, or another voltage instead of 400 V.

| Operating State | Condition | $V_{316}$ | $V_{317}$ | $V_{312}$ | $V_{314}$ | $V_{318}$ |
|---|---|---|---|---|---|---|
| 312 is drain/ 314 is source | On | 10 | 10 | 400 | 0 | 0 |
| 312 is drain/ 314 is source | Off | 410 | 0 | 1 | 0 | 0 |
| 312 is source/ 314 is drain | On | 10 | 10 | 0 | 1 | 0 |
| 312 is source/ 314 is drain | Of | 0 | 410 | 0 | 400 | 0 |

FIG. 4 includes an exemplary packaged electronic device 400 of a physical embodiment in accordance with the circuit as illustrated in the embodiment of FIG. 3. The packaged electronic device 400 includes a die 420 including the switch transistor 320, a die 430 including the bidirectional HEMT 330, and a die 440 including the switch transistor 340. Each of the dies 420 and 440 can be physically coupled to the die 430. The dies 420, 430, and 440 include bond pads for making connections, and the package substrate 250 can include package leads. Electrical connections between the bond pads and package leads will be addressed before addressing the electrical connections between the die 420, 430, and 440. In FIG. 4, the same package substrate 250 and package lead configuration as illustrated in FIG. 2 can be used. In a different embodiment, a different package substrate, package lead configuration or both may be used.

A source bond pad 422 of the die 420 is electrically connected to the drain/source package lead 252 of the package substrate 250. As illustrated in the embodiment of FIG. 4, the electrical connection is made by a conductor 462 that contacts the source bond pad 422 and the drain/source package lead 252. A Kelvin bond pad 423 of the die 420 is electrically connected to the Kelvin package lead 253 of the package substrate 250. The electrical connection is made by a conductor 463 that contacts the Kelvin bond pad 423 and the Kelvin package lead 253. A source bond pad 444 of the die 440 is electrically connected to the source/drain package lead 254 of the package substrate 250. The electrical connection is made by a conductor 464 that contacts the source bond pad 444 and the source/drain package lead 254. A Kelvin bond pad 445 of the die 440 is electrically connected to the Kelvin package lead 255 of the package substrate 250. The electrical connection is made by a conductor 465 that contacts the Kelvin bond pad 425 and the Kelvin package lead 255. Similar to the embodiments of FIGS. 2 and 3, the Kelvin connections in the embodiments of FIGS. 3 and 4 are made to the die directly which allows for more accurate voltage measurement.

A gate bond pad 426 of the die 420 is electrically connected to the gate package lead 256 of the package substrate 250. The electrical connection is made by a conductor 466 that contacts the gate bond pad 426 and the gate package lead 256. A gate bond pad 427 of the die 420 is electrically connected to the gate package lead 257 of the package substrate 250. The electrical connection is made by a conductor 467 that contacts the gate bond pad 427 and the gate package lead 257.

Unlike the embodiment of FIGS. 1 and 2, the embodiment of FIGS. 3 and 4 has a gate of the bidirectional HEMT 330 coupled to the source of the switch transistor 320, and another gate of the bidirectional HEMT 330 coupled to the source of the switch transistor 340. In an embodiment, the couplings are electrical connections via package leads of the package substrate 250 and conductors. More particularly, a gate bond pad 436 of the die 430 is electrically connected to the drain/source package lead 252 of the package substrate 250. The electrical connection is made by a conductor 476 that contacts the gate bond pad 436 and the drain/source package lead 252. A gate bond pad 437 of the die 430 is electrically connected to the source/drain package lead 254 of the package substrate 250. The electrical connection is made by a conductor 477 that contacts the gate bond pad 437 and the source/drain package lead 254.

The die substrate of the die 430 (not visible in FIG. 4) is electrically connected to a die substrate package lead 258 of the package substrate 250. The electrical connection is made by a conductor (not illustrated) that contacts the die substrate and the die substrate package lead 258.

The connectors 462 to 467, 476, 477, and the one for the die substrate may be in any one of variety of forms as previously described with respect to FIG. 2. As illustrated in the embodiment, the conductors 462 and 464 are clips, the conductors 463, 465, 466, 467, 476, and 477 are wires and can be replaced by conductive bumps, clips, etc. In another embodiment, the connector that contacts the die substrate and the die substrate package lead 258 can include a solder, a conductive adhesive such as conductive epoxy, etc.

The physical and electrical couplings between the bidirectional HEMT 330 and the switch transistors 320 and 340 can be achieved in a variety of different ways. In an embodiment, each of the dies 420 and 440 has a drain contact along the backside of the die The die 420 can be placed over a drain/source bond pad 432 of the die 430. In this manner, an electrical connection between the drain of the switch transistor 320 and the drain/source of the bidirectional HEMT 330. The same or similar type of connection may be made between dies 430 and 440 to make an electrical connection between the source/drain of the bidirectional HEMT 330 and the drain of the switch transistor 340.

Figure 5:
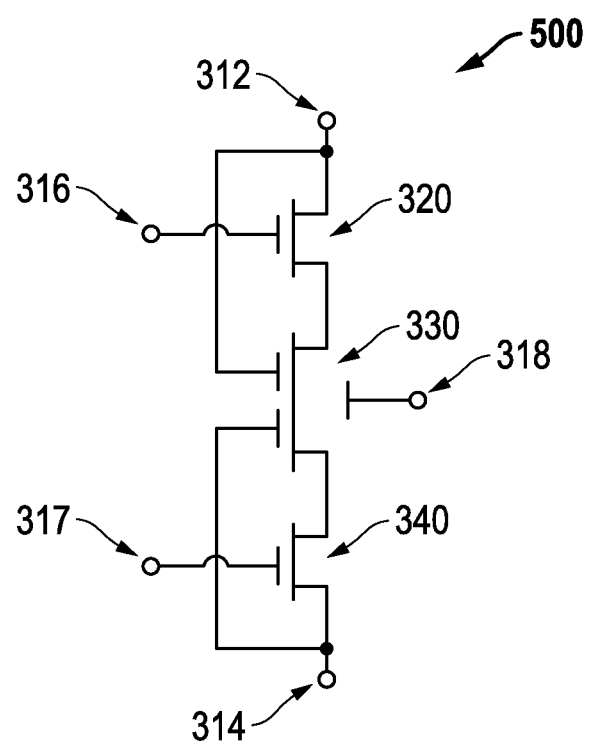
FIG. 5 includes a schematic of a circuit including a bidirectional HEMT and switch transistors.

FIG. 5 includes a schematic of an electronic device 500 that includes a bidirectional HEMT 330 and switch transistors 320 and 340. FIG. 5 is identical to FIG. 3 except that the Kelvin connections are not present. Without the Kelvin connection, the electronic device 500 has fewer external connections.

Figure 6:
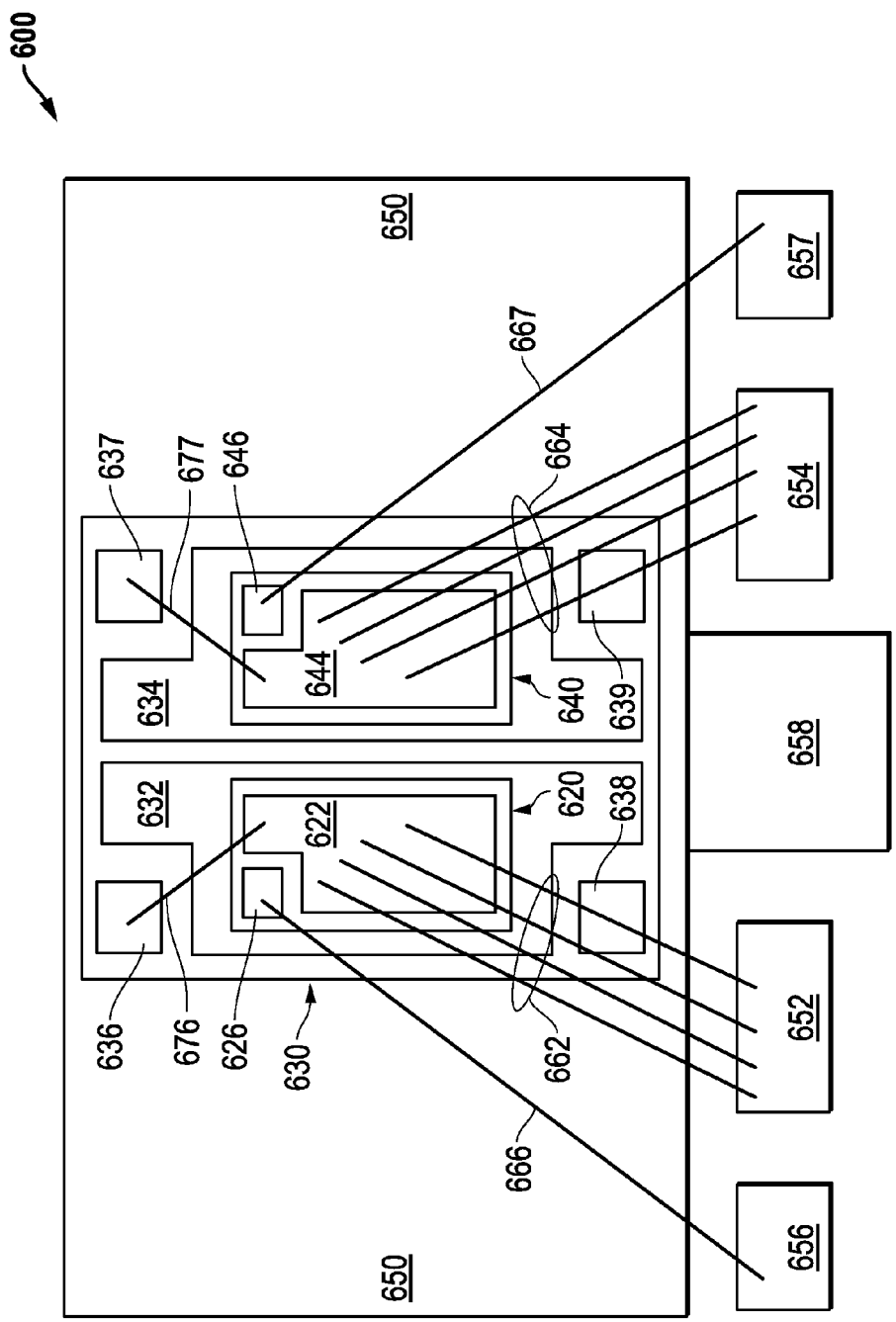
FIG. 6 includes an illustration of a top view of a package configuration for a packaged electronic device including the circuit of FIG. 5.

FIG. 6 includes an exemplary packaged electronic device 600 of a physical embodiment in accordance with the circuit as illustrated in the embodiment of FIG. 5. The packaged electronic device 600 includes a die 620 including the switch transistor 320, a die 630 including the bidirectional HEMT 330, and a die 640 including the switch transistor 340. The die 630 can be physically coupled to the package substrate 650. In this embodiment, each of the dies 620 and 640 can be physically coupled to the package substrate 650, as opposed to an underlying die. The dies 620, 630, and 640 include bond pads for making connections, and the package substrate 650 can include package leads. In FIG. 6, the package substrate 650 and package lead configuration is different as compared to the embodiments illustrated in FIGS. 2 and 4. Only five package leads are used for the circuit.

A source bond pad 622 of the die 620 is electrically connected to the drain/source package lead 652 of the package substrate 650. As illustrated in the embodiment of FIG. 6, the electrical connection is made by a conductor 662, in the form of a set of wires, that contacts the source bond pad 622 and the drain/source package lead 652. A source bond pad 644 of the die 640 is electrically connected to a source/drain package lead 654 of the package substrate 650. The electrical connection is made by a conductor 664, in the form of another set of wires, that contacts the source/drain bond pad 644 and the source/drain package lead 654.

A gate bond pad 626 of the die 620 is electrically connected to the gate package lead 656 of the package substrate 650. The electrical connection is made by a conductor 666 that contacts the gate bond pad 626 and the gate package lead 656. A gate bond pad 626 of the die 620 is electrically connected to the gate package lead 657 of the package substrate 650. The electrical connection is made by a conductor 667 that contacts the gate bond pad 627 and the gate package lead 657.

Similar to the embodiment of FIGS. 3 and 4, the embodiment of FIGS. 5 and 6 has a gate of the bidirectional HEMT 330 coupled to the drain/source of the switch transistor 320, and another gate of the bidirectional HEMT 330 coupled to the source/drain of the switch transistor 340. In an embodiment, the couplings are electrical connections via bond pads of the dies 620, 630, and 640 and conductors, and the package leads of the package substrate 650 are not used. More particularly, a gate bond pad 636 of the die 630 is electrically connected to the source bond pad 622 of the die 620. The electrical connection is made by a conductor 676 that contacts the gate bond pad 636 and the source bond pad 622. A gate bond pad 637 of the die 630 is electrically connected to the source bond pad 644 of the die 640. The electrical connection is made by a conductor 677 that contacts the gate bond pad 637 and the source bond pad 644.

The die substrate of the die 630 (not visible in FIG. 6) is electrically connected to a die substrate package lead 658 of the package substrate 650. The electrical connection is made by a conductor (not illustrated) that contacts the die substrate and the die substrate package lead 658.

The connectors 662 to 667, 676, 677, and the one for the die substrate may in any one of variety of forms as previously described with respect to FIG. 2. As illustrated in the embodiment, the conductors 662 to 667, 676, and 677 include wires and can be replaced by conductive bumps or clips etc. In an embodiment, the conductors 662 and 664 can include clips instead of the set of wires, as the conductors 662 and 664 may carry significantly more current than the other conductors. In another embodiment, the connector that contacts the die substrate and the die substrate package lead 658 can include a solder or a conductive adhesive.

The physical and electrical couplings between the bidirectional HEMT 330 and the switch transistors 320 and 340 can be achieved in a variety of different ways. In an embodiment, each of the dies 620 and 640 has a drain contact along the backside of the die, similar to the dies 420 and 440. As illustrated, bond pads 622 and 644 are relatively large, and in a further embodiment, a solder or a conductive adhesive may be used between through-substrate vias and the bond pads 622 and 644. In a further embodiment, the dies 620, 630, and 640 can be modified to include bond pads and wire bonds to allow the electrical connections between the bidirectional HEMT 330 and the switch transistors 320 and 340.

Gate bond pads 638 and 639 of the die 630 are also electrically connected to the gate electrodes of the bidirectional HEMT and are not used in this embodiment. In an alternative embodiment, a connector (not illustrated) can connect the gate bond pad 638 to the source bond pad 622 of the die 620 or the drain/source package lead 652. In another embodiment, a connector (not illustrated) can connect the gate bond pad 639 to the source bond pad 644 of the die 640 or the source/drain package lead 654. The additional connection for the gate bond pad 638 or 639 or both connections can help reduce resistance and provide a stronger voltage signal to the corresponding gate of the bidirectional HEMT 330. The gate bond pads 638 and 639 may allow for more flexibility for using in different package designs that will be more apparent with the description of the embodiment of FIG. 7 below.

Figure 7:
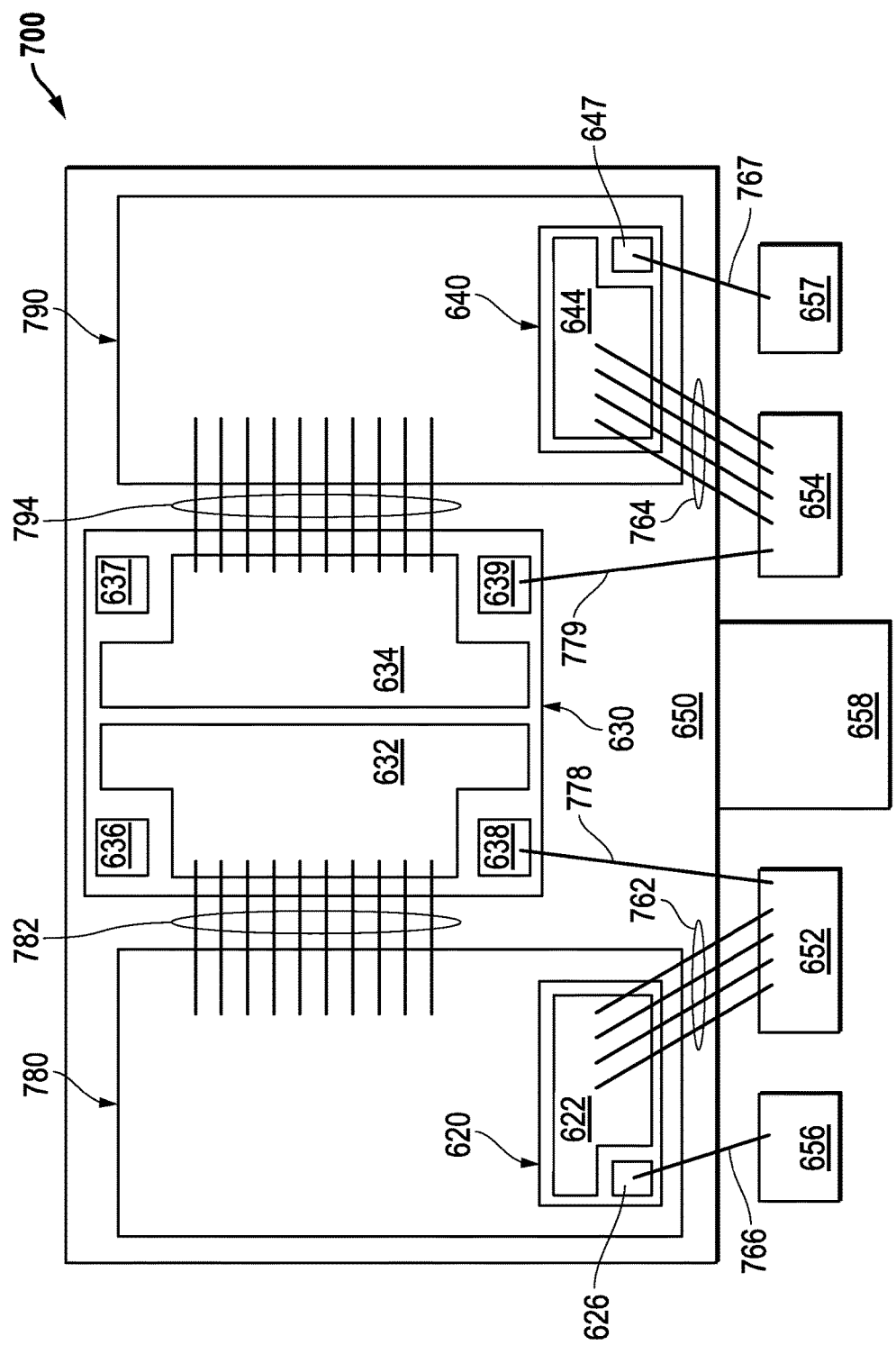
FIG. 7 includes an illustration of a top view of a package configuration for a packaged electronic device including the circuit of FIG. 5.

FIG. 7 includes an exemplary packaged electronic device 700 of a physical embodiment in accordance with the circuit as illustrated in the embodiment of FIG. 5. The packaged electronic device 700 includes the die 620 including the switch transistor 320, the die 630 including the bidirectional HEMT 330, and the die 640 including the switch transistor 340. In this embodiment, the die 620 and 640 do not overlie the die 630.

In this embodiment, each of the dies 620 and 640 can be physically coupled to an intermediate substrate, as opposed to an underlying die. The dies 620 and 640 can be physically coupled to intermediate substrates 780 and 790, respectively, where each of the intermediate substrates 780 and 790 includes an insulating base covered by a conductive layer, which is illustrated in FIG. 7. The insulating base can include a ceramic material and is attached to the package substrate 650. The insulating base isolates the conductive layer from contacting the package lead 658. The die 630 can be physically coupled to the package substrate 650. The dies 620, 630, and 640 include bond pads for making connections, and the package substrate 650 can include package leads. The package substrate 650 and package leads in FIG. 7 are the same as in FIG. 6. In another embodiment, a different package substrate or package lead configuration may be used.

A source bond pad 622 of the die 620 is electrically connected to the drain/source package lead 652 of the package substrate 650. As illustrated in the embodiment of FIG. 7, the electrical connection is made by a conductor 762, in the form of a set of wires that contacts the source bond pad 622 and the drain/source package lead 652. A source bond pad 644 of the die 640 is electrically connected to a source/drain package lead 654 of the package substrate 650. The electrical connection is made by a conductor 764, in the form of another set of wires, that contacts the source bond pad 644 and the source/drain package lead 654.

A gate bond pad 626 of the die 620 is electrically connected to the gate package lead 656 of the package substrate 650. The electrical connection is made by a conductor 766 that contacts the gate bond pad 626 and the gate package lead 656. A gate bond pad 647 of the die 640 is electrically connected to the gate package lead 657 of the package substrate 650. The electrical connection is made by a conductor 767 that contacts the gate bond pad 647 and the gate package lead 657.

FIG. 7 has a gate of the bidirectional HEMT 330 coupled to the source of the switch transistor 320, and another gate of the bidirectional HEMT 330 coupled to the source of the switch transistor 340. In an embodiment, the couplings are electrical connections via bond pads of the dies 620, 630, and 640 and conductors, and the package leads of the package substrate 650 are not used. More particularly, a gate bond pad 638 of the die 630 is electrically connected to the source bond pad 622 of the die 620 through the connection to the package lead 652 of the package substrate 650. The electrical connection is made by a conductor 778 that contacts the gate bond pad 638 and the drain/source bond pad 652. A gate bond pad 639 of the die 630 is electrically connected to the source bond pad 644 of the die 640 through the connection to the package lead 654 of the package substrate 650. The electrical connection is made by a conductor 779 that contacts the gate bond pad 636 and the source/drain bond pad 654.

The extra gate bond pads of the die 330 including the bidirectional HEMT allow for more flexibility arranging the die 630 in a variety of package substrate or package lead configurations. In the embodiment illustrated in FIG. 6, gate bond pads 636 and 637 are used in electrical connections between the die 630 and each of the die 620 and 640 without require a connection via a package lead. Gate bond pads 638 and 639 are not used. Referring to the embodiment illustrated in FIG. 7, gate bond pads 638 and 639 are used in electrical connections between the die 630 and each of the die 620 and 640 via package leads 652 and 654, respectively. Gate bond pads 636 and 637 are not used. In another embodiment (not illustrated), the gate bond pad 636 and 637 of the bidirectional HEMT die 630 could be used to make connections to the source bond pads of their corresponding switch transistors or the drain/source or source/drain package leads 652 or 654. Thus, the gate bond pad configuration of the bidirectional HEMT die 630 can provide more flexibility with a manufacturing line without having to make an irreversible decision at a metal mask operation during fabrication of the die 630 with respect to the gate connections.

The die substrate of the die 630 (not visible in FIG. 7) is electrically connected to a die substrate package lead 658 of the package substrate 650. The electrical connection is made by a conductor (not illustrated) that contacts the die substrate and the die substrate package lead 658.

The backside drain contact of die 620 is electrically connected to the conductive layer of the intermediate substrate 780. A connector 782 contacts the conductive layer of the intermediate substrate 780 and the drain/source bond pad 632 of the die 630. In an embodiment, the conductor 782 is a form of a set of wires. The backside drain contact of the die 640 is electrically connected to the conductive layer of the intermediate substrate 790. A conductor 794 contacts the conductive layer of the intermediate substrate 790 and the source/drain bond pad 634 of the die 630. In an embodiment, the conductor 794 is a form of a set of wires.

The connectors 762 to 767, 778, 779, 782, 794 and the one for the die substrate may in any one of variety of forms as previously described with respect to FIG. 2. As illustrated in the embodiment, the conductors 762 to 767, 778, 779, 782 and 794 include wires and can be replaced by conductive bumps. In an embodiment, the conductors 762, 764, 782, and 794 can include clips instead of the set of wires, as the conductors 762, 764, 782, and 794 may carry significantly more current that the other conductors. In another embodiment, the connector that contacts the die substrate and the die substrate package lead 658 can include a conductive adhesive.

The physical and electrical couplings between the bidirectional HEMT 330 and the switch transistors 320 and 340 can be achieved in a variety of different ways. Many alternatives have previously been discussed with respect to FIG. 6 and may be applicable to FIG. 7.

Figure 8:
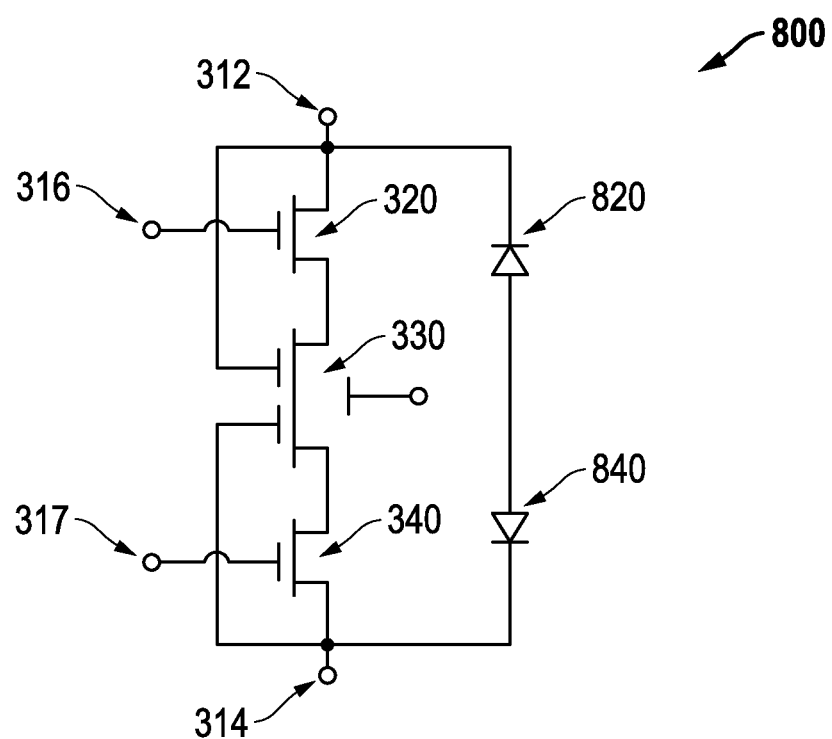
FIG. 8 includes a schematic of a circuit including a bidirectional HEMT and switch transistors and diodes for unclamped inducting switching capability.

FIG. 8 includes a schematic of an electronic device 800 that includes a bidirectional HEMT 330 and switch transistors 320 and 340. FIG. 8 is identical to FIG. 5 except that diodes 820 and 840 are added and can provide UIS capability. The diode 820 includes a cathode coupled to the source of the switch transistor 320 and an anode coupled to an anode of the diode 840, and a cathode of the diode 840 is coupled to the source of the switch transistor 340. The configuration of the diodes 820 and 840 ensures that one of the diodes 820 and 840 is reversed biased when there is a voltage difference between the terminals 312 and 314.

The circuit 800 can operate at relatively high power and operating frequency. The diodes 820 and 840 to help protect any combination of the transistors 320, 330, and 340 for voltage swings that occur under normal operating conditions. As switching frequency increases (e.g., greater than 10 kHz) for circuits having a high nominal design voltage (greater than 150V), the voltage difference between the drain/source of the transistor 320 and the source/drain of the transistor 340 can be 50% or even higher than the nominal design voltage under normal operating conditions.

As a particular example, the circuit 500 in FIG. 5 may have a nominal design voltage of 400 V, and the voltage difference between the drain/source of the transistor 320 and the source/drain of the transistor 340 may exceed 600 V. Thus, transistor 320, 330, 340, or any combination may need to be designed to withstand a voltage difference of 650 V, and possibly higher. The performance of the circuit 500 may be compromised by transistors that are designed to withstand such high voltages.

Unlike circuit 500, the diodes 820 and 840 can be designed to clamp the voltage difference to a lower value. Each of the diodes 820 and 840 can have an avalanche breakdown voltage higher than the normal operating voltage difference between the drain/source and source/drain terminals 312 and 314 of circuit 800. In an embodiment, each of the diodes 820 and 840 may have breakdown voltages such that voltage fluctuations of the power supply used to drive the circuit 800 do not cause the diodes 820 and 840 to go into avalanche breakdown. For example, a power supply used to drive the circuit 800 may be allowed to vary by up to 10% without switching occurring. In a particular embodiment, the avalanche breakdown voltage can be at least 10% higher than the normal operating voltage difference. Thus, for a 400 V power supply, the diodes 820 and 840 may have a breakdown voltage of at least 440 V. In another particular embodiment, the avalanche breakdown voltage can be at most 1000% higher than the normal operating voltage difference. As an upper limit for the breakdown voltages, one or more of the transistors 320, 330, and 340 may be able to withstand only 550 V before any of the transistors are irreversibly damaged. In this particular example, each of the diodes 820 and 840 may have a breakdown voltage between 440 V and 550 V. After reading this specification, skilled artisans will be able to determine a breakdown voltage needed or desired for a particular application. The diodes 820 and 840 can allow for a more aggressive design for transistors 320, 330, and 340 to allow for better performance of the circuit 800.

Figure 9:
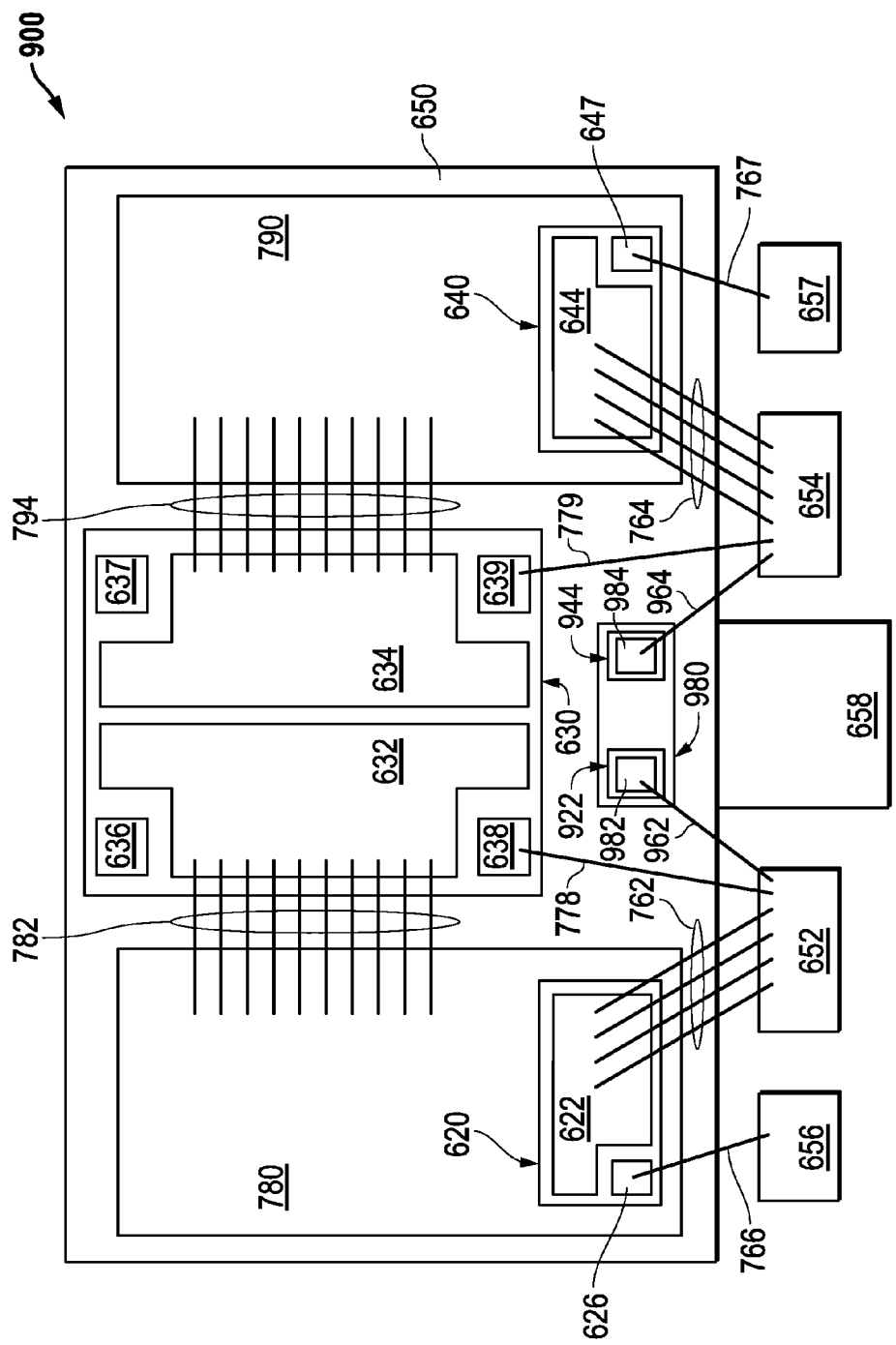
FIG. 9 includes an illustration of a top view of a package configuration for a packaged electronic device including the circuit of FIG. 8.

FIG. 9 includes an exemplary packaged electronic device 900 of a physical embodiment in accordance with the circuit as illustrated in the embodiment of FIG. 8. The packaged electronic device 900 is identical to the packaged electronic device 700 of FIG. 7 except that an intermediate substrate 980 and dies 922 and 944 for the diodes 820 and 840, is added. The intermediate substrate 980 includes an insulating base covered by a conductive layer, which is illustrated in FIG. 9. The insulating base can include a ceramic material and is attached to the package substrate 650. The insulating base isolates the conductive layer from contacting the package lead 658. A connector 962 connects a cathode bond pad 982 of the die 922 to the drain/source package lead 652, and a connector 964 connects a cathode bond pad 984 to the source/drain package lead 654. Each of the dies 922 and 944 have backside contacts that are made to the conductive layer of the intermediate substrate 980 to electrically connect the anodes of diodes 820 and 840 to each other. As illustrated in FIG. 9, the conductors 962 and 964 are wires, and similar to other embodiments, the conductors 962 and 964 may be in another form as other types of connectors as in other embodiments previously described.

In another embodiment (not illustrated), the diodes 820 and 840 may be different parts of the same die. In a further embodiment, the diodes may be integrated into one or both of the dies 620 and 640. After reading this specification, skilled artisans will be able to determine a physical implementation of the diodes 820 and 840 that meets the needs or desires for a particular application.

Many different package types may be used. The embodiments as illustrated in FIGS. 2 and 4 are well suited for quad flat no-package lead (QFN) packages and quad flat packages (QFP). The embodiments as illustrated in FIGS. 6, 7, and 8 are well suited for packages that have through-package connectors, and such packages may have solder balls or be configured to receive solder balls to allow a reflow operation to make electrical connections between the packaged electronic device and a circuit board or a socket. The packaged electronic devices may be plastic or ceramic and may or may not be hermetically sealed. After reading this specification, skilled artisans will be able to determine the materials for the packages, the type of seal, and how electrical connections are to be made external to the packaged electronic device.

Although die with the switch transistors 320 and 340 are described and illustrated as having through-substrate vias, such through-substrate vias are not required for all embodiments. In another embodiment, all connections to the drain/source, gate, and source/drain of either or both of the switch transistors 320 and 340 may be with bond pads along one of the major surfaces of the corresponding die.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1. A circuit, comprising:
a first transistor including a source and a drain;
a bidirectional HEMT including a drain/source and a source/drain;
a second transistor including a source and a drain;
a first diode having an anode and a cathode; and
a second diode having an anode and a cathode,
wherein:
the drain of the first transistor is coupled to the drain/source of the bidirectional HEMT transistor;
the source/drain of the bidirectional HEMT transistor is coupled to the drain of the third transistor;
the cathode of the first diode is coupled to the source of the first transistor;
the anode of the first diode is coupled to the anode of the second diode; and
the cathode of the second diode is coupled to the source of the third transistor.

Embodiment 2. The circuit of Embodiment 1, wherein the bidirectional HEMT includes a first gate coupled to the source of the first transistor, and a second gate coupled to the source of the second transistor.

Embodiment 3. The circuit of Embodiment 1, wherein the bidirectional HEMT is a depletion mode transistor.

Embodiment 4. The circuit of Embodiment 1, wherein the first and second transistors are enhancement mode transistors.

Embodiment 5. The circuit of Embodiment 1, wherein the first and second transistors are Si MOSFETs.

Embodiment 6. The circuit of Embodiment 1, wherein the bidirectional HEMT and first and second transistors are parts of a same die.

Embodiment 7. The circuit of Embodiment 1, wherein the bidirectional HEMT is on a different die as compared to the first and second diodes.

Embodiment 8. The circuit of Embodiment 1, wherein each of the first and second diodes has a breakdown voltage sufficient to support a nominal designed voltage difference between the first source of the first transistor and the source of the second transistor.

Embodiment 9. The circuit of Embodiment 1, wherein a die substrate of a die that includes the bidirectional HEMT is configured to be at a fixed voltage, switched between the sources of the first and second transistors depending on desired current flow through the circuit, or electrically float.

Embodiment 10. A packaged electronic device, comprising:
a bidirectional circuit including:
a bidirectional HEMT including a drain/source and a source/drain;
a drain/source bond pad;

a first Kelvin bond pad, wherein the drain/source of the bidirectional HEMT, the drain/source bond pad, and first Kelvin bond pad are spaced apart from one another;
a source/drain bond pad; and
a second Kelvin bond pad, wherein the source/drain of the bidirectional HEMT, the source/drain bond pad, and second Kelvin bond pad are spaced apart from one another;
a drain/source package lead that is electrically connected to the drain/source bond pad via a first connector;
a first Kelvin package lead that is electrically connected to the first Kelvin bond pad via a second connector, wherein the first Kelvin package lead is spaced apart from the drain/source package lead;
a source/drain package lead that is electrically connected to the source/drain bond pad via a third connector; and
a second Kelvin package lead that is electrically connected to the second Kelvin bond pad via a fourth connector, wherein the second Kelvin package lead is spaced apart from the source/drain package lead.

Embodiment 11. The packaged electronic device of Embodiment 10, further comprising a die substrate package lead, wherein the bidirectional HEMT is part of a die that includes a die substrate, wherein the die substrate is conductively attached to the die substrate package lead.

Embodiment 12. The packaged electronic device of Embodiment 10, further comprising a fifth package lead and a sixth package lead, wherein:
the bidirectional HEMT circuit further includes:
a first transistor including a first gate coupled to a first gate bond pad, wherein the first transistor is coupled between the drain/source package lead and the drain/source bond pad of the bidirectional HEMT; and
a second transistor including a second gate coupled to a second gate bond pad, wherein the second transistor coupled between the source/drain package lead and the source/drain bond pad of the bidirectional HEMT;
the first gate package lead is electrically connected to the first gate bond pad via a fifth connector; and
the second gate package lead is electrically connected to the second gate bond pad via a sixth connector.

Embodiment 13. The packaged electronic device of Embodiment 10, wherein:
the bidirectional HEMT circuit includes:
a first transistor coupled between the drain/source package lead and the drain/source bond pad of the bidirectional HEMT; and
a second transistor coupled between the source/drain package lead and the source/drain bond pad of the bidirectional HEMT;
the bidirectional HEMT and the first and second transistors are parts of different die;
the die of the first transistor is mounted over the die of the bidirectional HEMT; and
the die of the second transistor is mounted over the die of the bidirectional HEMT.

Embodiment 14. The packaged electronic device of Embodiment 10, wherein:
the bidirectional HEMT circuit includes:
a first transistor coupled between the drain/source package lead and the drain/source bond pad of the bidirectional HEMT; and
a second transistor coupled between the source/drain package lead and the source/drain bond pad of the bidirectional HEMT;

the bidirectional HEMT and the first and second transistors are parts of a same die.

Embodiment 15. A packaged electronic device, comprising:
  a bidirectional HEMT circuit and including a bidirectional HEMT over a die substrate of a die and including a drain/source and a source/drain;
  a drain/source package lead coupled to a drain/source of the bidirectional HEMT;
  a source/drain package lead coupled to a source/drain of the bidirectional HEMT;
  a die substrate package lead coupled to the die substrate of the die; and
  the die substrate package lead is configured to be at a fixed voltage, electrically connected to a drain/source or a source/drain of the bidirectional HEMT circuit depending on current flow through the bidirectional HEMT circuit, or electrically float.

Embodiment 16. The packaged electronic device of Embodiment 15, further comprising a drain/source bond pad of the bidirectional HEMT coupled to the drain/source package lead, and a source/drain bond pad of the bidirectional HEMT coupled to the source/drain package lead.

Embodiment 17. The packaged electronic device of Embodiment 16, further comprising a first gate package lead and a second gate package lead, wherein the bidirectional HEMT circuit further comprises:
  a first transistor coupled between the drain/source package lead and the drain/source bond pad of the bidirectional HEMT, wherein the first transistor has a first gate coupled to a first gate bond pad; and
  a second transistor coupled between the source/drain package lead and the source/drain bond pad of the bidirectional HEMT, wherein the second transistor has a second gate coupled to a second gate bond pad.

Embodiment 18. The packaged electronic device of Embodiment 17, wherein the bidirectional HEMT, the first transistor, and the second transistor are on the same die.

Embodiment 19. The packaged electronic device of Embodiment 17, wherein the bidirectional HEMT, the first transistor, and the second transistor are on different die.

Embodiment 20. The packaged electronic device of Embodiment 16, wherein the packaged electronic device does not include a Kelvin package lead.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Accordingly, the disclosure is to be regarded as illustrative rather than restrictive.

What is claimed is:

1. A circuit, comprising:
  a first transistor including a source and a drain;
  a bidirectional HEMT including a drain/source and a source/drain;
  a second transistor including a source and a drain;
  a first diode having an anode and a cathode; and
  a second diode having an anode and a cathode,
  wherein:
    the drain of the first transistor is coupled to the drain/source of the bidirectional HEMT transistor;
    the source/drain of the bidirectional HEMT transistor is coupled to the drain of the second transistor;
    the cathode of the first diode is coupled to the source of the first transistor;
    the anode of the first diode is coupled to the anode of the second diode; and
    the cathode of the second diode is coupled to the source of the second transistor; and
    wherein a die substrate of a die that includes the bidirectional HEMT is configured to be at a fixed voltage, switched between the sources of the first and second transistors depending on desired current flow through the circuit, or electrically float.

2. The circuit of claim 1, wherein the bidirectional HEMT includes a first gate coupled to the cathode of the first diode, and a second gate coupled to the cathode of the second diode.

3. The circuit of claim 1, wherein the bidirectional HEMT is a depletion mode transistor.

4. The circuit of claim 1, wherein the first and second transistors are enhancement mode transistors.

5. The circuit of claim 1, wherein the first and second transistors are Si MOSFETs.

6. The circuit of claim 1, wherein the bidirectional HEMT and first and second transistors are parts of a same die.

7. The circuit of claim 1, wherein the bidirectional HEMT is on a different die as compared to the first and second diodes.

8. The circuit of claim 1, wherein each of the first and second diodes has a breakdown voltage sufficient to support a nominal designed voltage difference between the source of the first transistor and the source of the second transistor.

9. A packaged electronic device, comprising:
  a bidirectional circuit including:
    a bidirectional HEMT including a drain/source and a source/drain;
    a drain/source bond pad;
    a first Kelvin bond pad, wherein the drain/source of the bidirectional HEMT, the drain/source bond pad, and first Kelvin bond pad are spaced apart from one another;
    a source/drain bond pad; and
    a second Kelvin bond pad, wherein the source/drain of the bidirectional HEMT, the source/drain bond pad, and second Kelvin bond pad are spaced apart from one another;
  a drain/source package lead that is electrically connected to the drain/source bond pad via a first connector;

a first Kelvin package lead that is electrically connected to the first Kelvin bond pad via a second connector, wherein the first Kelvin package lead is spaced apart from the drain/source package lead;
a source/drain package lead that is electrically connected to the source/drain bond pad via a third connector; and
a second Kelvin package lead that is electrically connected to the second Kelvin bond pad via a fourth connector, wherein the second Kelvin package lead is spaced apart from the source/drain package lead.

10. The packaged electronic device of claim 9, further comprising a die substrate package lead, wherein the bidirectional HEMT is part of a die that includes a die substrate, wherein the die substrate is conductively attached to the die substrate package lead.

11. The packaged electronic device of claim 9, further comprising a fifth package lead and a sixth package lead, wherein:
the bidirectional HEMT circuit further includes:
a first transistor including a first gate coupled to a first gate bond pad, wherein the first transistor is coupled between the drain/source package lead and the drain/source bond pad of the bidirectional HEMT; and
a second transistor including a second gate coupled to a second gate bond pad, wherein the second transistor coupled between the source/drain package lead and the source/drain bond pad of the bidirectional HEMT;
the first gate package lead is electrically connected to the first gate bond pad via a fifth connector; and
the second gate package lead is electrically connected to the second gate bond pad via a sixth connector.

12. The packaged electronic device of claim 9, wherein: the bidirectional HEMT circuit includes:
a first transistor coupled between the drain/source package lead and the drain/source bond pad of the bidirectional HEMT; and
a second transistor coupled between the source/drain package lead and the source/drain bond pad of the bidirectional HEMT;
the bidirectional HEMT and the first and second transistors are parts of different die;
the die of the first transistor is mounted over the die of the bidirectional HEMT; and
the die of the second transistor is mounted over the die of the bidirectional HEMT.

13. The packaged electronic device of claim 9, wherein: the bidirectional HEMT circuit includes:
a first transistor coupled between the drain/source package lead and the drain/source bond pad of the bidirectional HEMT; and
a second transistor coupled between the source/drain package lead and the source/drain bond pad of the bidirectional HEMT;
the bidirectional HEMT and the first and second transistors are parts of a same die.

14. A packaged electronic device, comprising:
a bidirectional HEMT circuit and including a bidirectional HEMT over a die substrate of a die and including a drain/source and a source/drain;
a drain/source package lead coupled to a drain/source of the bidirectional HEMT;
a source/drain package lead coupled to a source/drain of the bidirectional HEMT;
a die substrate package lead coupled to the die substrate of the die; and
the die substrate package lead is configured to be at a fixed voltage, electrically connected to a drain/source or a source/drain of the bidirectional HEMT circuit depending on current flow through the bidirectional HEMT circuit, or electrically float.

15. The packaged electronic device of claim 14, further comprising a drain/source bond pad of the bidirectional HEMT coupled to the drain/source package lead, and a source/drain bond pad of the bidirectional HEMT coupled to the source/drain package lead.

16. The packaged electronic device of claim 15, further comprising a first gate package lead and a second gate package lead, wherein the bidirectional HEMT circuit further comprises:
a first transistor coupled between the drain/source package lead and the drain/source bond pad of the bidirectional HEMT, wherein the first transistor has a first gate coupled to a first gate bond pad; and
a second transistor coupled between the source/drain package lead and the source/drain bond pad of the bidirectional HEMT, wherein the second transistor has a second gate coupled to a second gate bond pad.

17. The packaged electronic device of claim 16, wherein the bidirectional HEMT, the first transistor, and the second transistor are on the same die.

18. The packaged electronic device of claim 16, wherein the bidirectional HEMT, the first transistor, and the second transistor are on different die.

19. The packaged electronic device of claim 15, wherein the packaged electronic device does not include a Kelvin package lead.

* * * * *